United States Patent [19]
Newman et al.

[11] 4,038,560
[45] July 26, 1977

[54] PULSE SHAPING CIRCUIT FOR SHRIMP FISHING APPARATUS LOAD

[76] Inventors: James L. Newman, 1321 Glen Cove, Richardson, Tex. 75080; M. Marion Hawthorne, 4824 Overton, Fort Worth, Tex. 76133

[21] Appl. No.: 500,146

[22] Filed: Aug. 23, 1974

Related U.S. Application Data

[60] Continuation of Ser. No. 303,412, Nov. 3, 1972, abandoned, which is a division of Ser. No. 883,187, Dec. 8, 1969, abandoned.

[51] Int. Cl.² ............................................. H03K 3/00
[52] U.S. Cl. .................................................. 307/106
[58] Field of Search .................. 307/104, 106, 108; 317/DIG. 6, 151; 43/9, 17.1; 328/66; 331/151, 129, 112, 131

[56] References Cited

U.S. PATENT DOCUMENTS

| | | | |
|---|---|---|---|
| 2,847,569 | 8/1958 | Finklestein | 331/151 |
| 3,045,148 | 7/1962 | McNulty et al. | 331/129 |
| 3,218,484 | 11/1965 | Matusche | 307/104 |
| 3,483,649 | 12/1969 | Klima et al. | 43/9 |
| 3,523,211 | 8/1970 | Oishi et al. | 317/DIG. 6 |

*Primary Examiner*—James R. Scott
*Attorney, Agent, or Firm*—Hubbard, Thurman, Turner & Tucker

[57] ABSTRACT

An apparatus for daylight shrimp fishing is disclosed. The apparatus includes a plurality of Otter trawls each having an electrode array and a pulse circuit. Each pulse circuit includes a capacitor which is discharged by a reversal of current to the capacitor which fires an SCR. A control unit located on the boat effects the discharging of the respective capacitors in a predetermined sequence to equalize the load on an alternating current generator. The electrode array has a plurality of electrodes which trail behind a bus extending between the trawl doors at a distance above the bottom. The electrodes are weighted to slide along the bottom and have an insulating material disposed above the conductor so that the electric current pulses are directed into the bottom rather than being dissipated upwardly into the water. The design of the bus and the electrode array is such as to insure uniform current density over the array.

14 Claims, 11 Drawing Figures

PULSE SHAPING CIRCUIT FOR SHRIMP FISHING APPARATUS LOAD

This is a continuation of application Ser. No. 303,412, filed Nov. 3, 1972, now abandoned, a division of application Ser. No. 883,187, filed Dec. 8, 1969, now abandoned.

This invention relates generally to shrimp trawling apparatus, and more particularly relates to an improved electric shrimp trawl.

Penaeus aztecus and penaeus duorarum shrimp are, by nature, nocturnal creatures. During the day, they burrow into the bottom of the sea and lie dormant. Only during the hours of darkness do they come out into the water to feed where they can be captured by a trawl net. Since shrimp boats normally operate a substantial distance from shore where it is impractical to return after each night's operation, about 50% of the total lapsed time of each fishing trip is not productive.

Researchers have discoverred that involuntary muscular contractions occur within the body of a shrimp when it is exposed to electrical impulses. When the voltage of the pulses exceed a certain threshold and are at a certain rate, the involuntary contractions are sufficient to cause a shrimp burrowed in the sea bottom to literally hop several inches out of its hiding place into the water so that it can be caught by a net. If the voltage from end to end of the shrimp does not exceed a certain threshold, or if the pulses are too slow or too fast, the shrimp do not hop out of the sea bottom. If the shrimp are oriented transversely of the polarlity of the electric field, the voltage from end to end of the shrimp is inadequate and no contractions result.

Electrical shrimp trawls utilizing this phenomenon have been successfully tested. In one such device, electrodes were arrayed between the trawl doors so as to trail the doors in hyperbolic arcs at spaced intervals in advance of the mouth of the trawl net. In other systems, such as that disclosed in U.S. Pat. No. 3,312,011, the electrodes were arrayed parallel to the direction of travel of the trawl net with the trailing ends attached to the footrope of the trawl and the leading ends attached to a support cable strung between the bottom edges of the trawl doors. While these systems allow a shrimp trawler to operate around the clock during the period that it is away from port, a number of problems exist with the system.

For maximum efficiency, shrimp trawlers normally utilize two separate Otter trawls together with a miniature trawl known as a try net. This invention is concerned with an improved system for operating one or more electric trawls with maximum efficiency. The system also materially reduces the number of components attached to the trawl, thus reducing the initial cost of the system and the loss in the event a tow line is broken. The invention is also concerned with a more efficient electrode and electrode array which will operate even over rough bottoms.

The novel features believed characteristic of this invention are set forth in the appended claims. The invention itself, however, as well as other objects and advantages thereof, may best be understood by reference to the following detailed description of illustrated embodiments when read in conjunction with the accompanying drawings, wherein:

Figure 1:
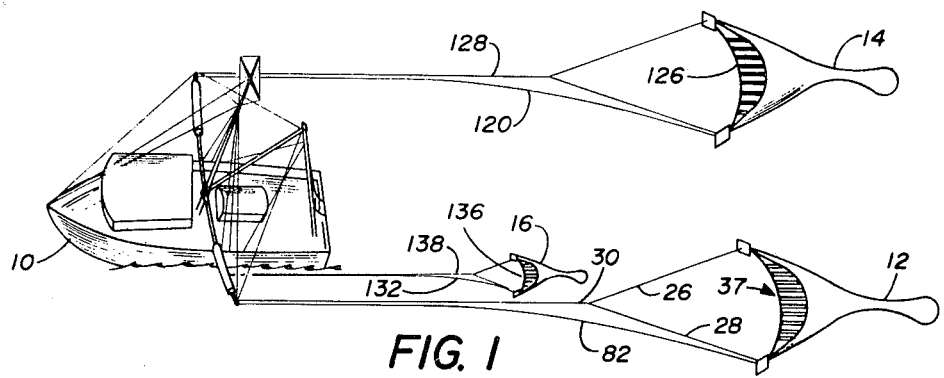
FIG. 1 illustrates a shrimp boat towing two Otter trawls and a try net all rigged in accordance with the present invention.
Figure 2:
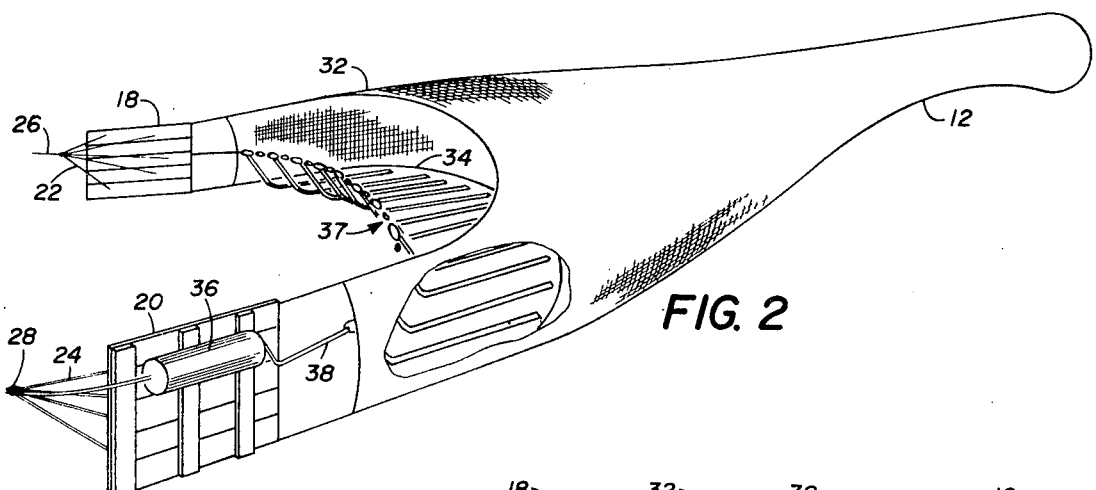
FIG. 2 is a perspective view of one of the Otter trawls of FIG. 1.
Figure 4:
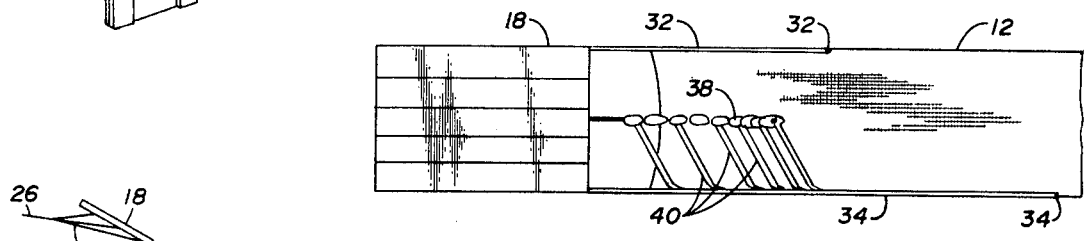
FIG. 4 is a partial sectional view taken on lines 4—4 of FIG. 3.
Figure 3:
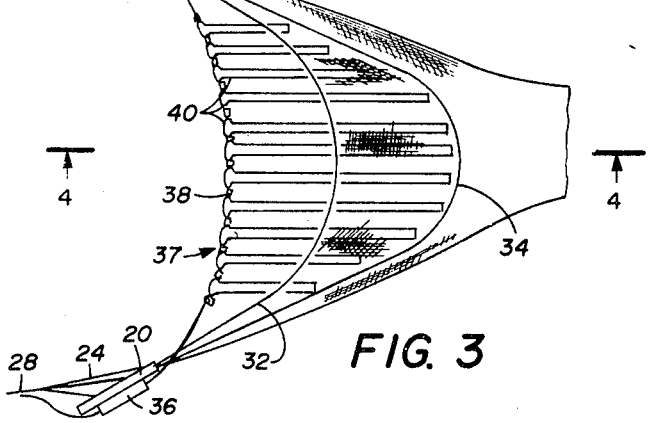
FIG. 3 is a partial plan view of the Otter trawl of FIG. 2.

Referring now to the drawings, and in particular to FIG. 1, a shrimp boat 10 is illustrated as towing first and second Otter trawls 12 and 14, and a "try" net 16. The Otter trawl 14 is identical to the Otter trawl 12 which is illustrated in FIGS. 2-4. The "try" net 16 is similar to the full-size Otter trawls except that it is substantially smaller. The trawl 12 includes a pair of Otter doors 18 and 20 which are connected by chains 22 and 24 to the bridle legs 26 and 28 to the tow cable 30. A headrope 32 extends between the upper rear corners of the doors 18 and 20, a footrope 34 extends between the lower rear corners of the door, and the net extends between the headrope 32 and footrope 34 substantially in the configuration illustrated as the net is pulled through the water by the boat.

A pulse circuit is disposed in a watertight container 36 affixed to the rear face of the door 20 and is connected to supply current pulses, as will presently be described, to an electrode array 37 which includes a bus wire 38 affixed to the trailing edges of the doors 18 and 20 at points spaced above the lower edges of the doors so as to be positioned a distance above the bottom as the trawl is pulled through the water. Floats may be attached to the bus 38 if desired to keep the bus at the desired height above the bottom. A plurality of electrodes 40 are attached both electrically and mechanically to the bus 38 and are weighted so as to trail along adjacent the bottom as hereafter described.

Figure 5:
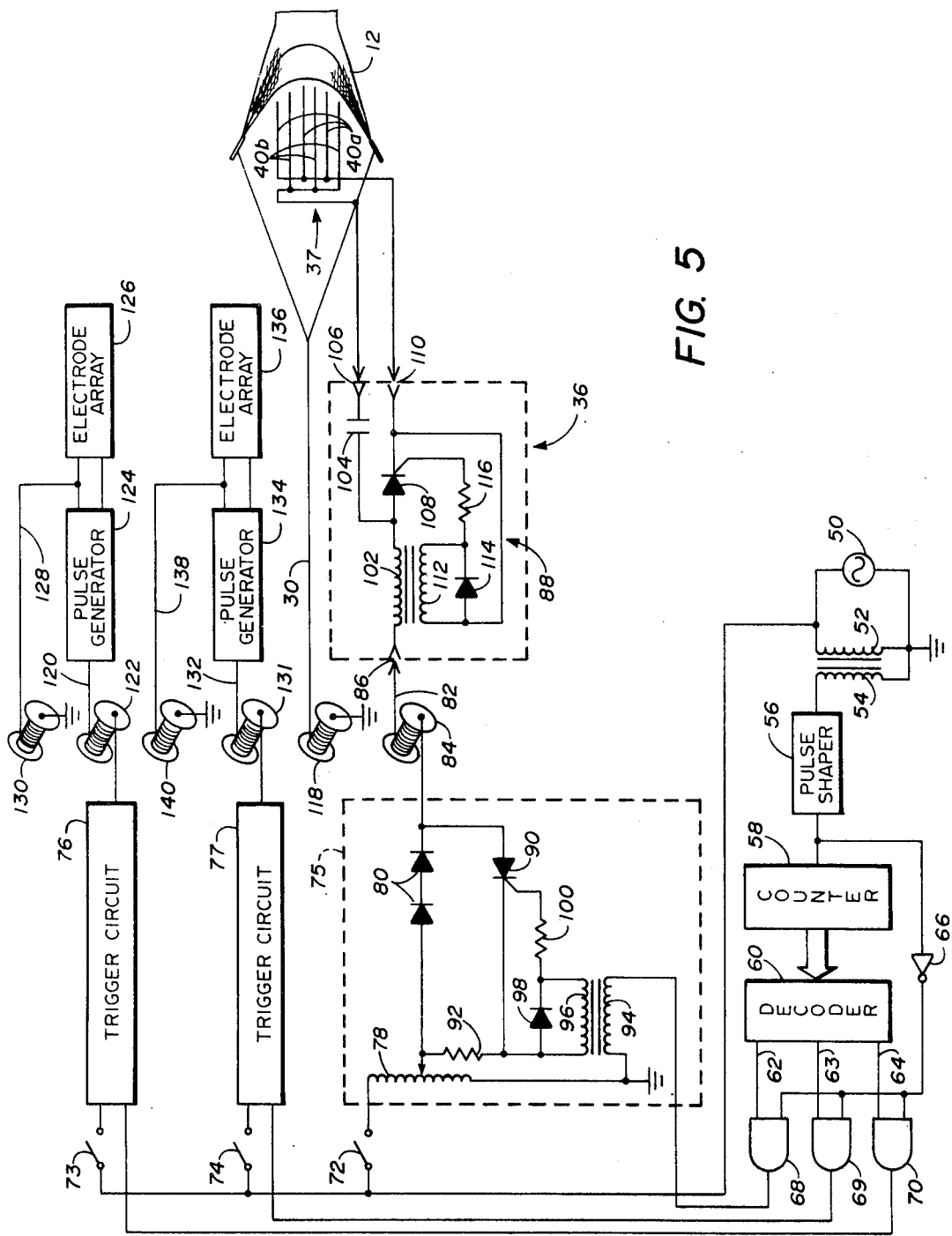
FIG. 5 is a schematic diagram illustrating the electrical system of the present invention.

Referring now to FIG. 5, alternating current generator 50 is located on the boat 10. The primary winding 52 of a transformer is connected across the generator 50. The secondary winding 54 supplies power to a pulse-shaping circuit 56, which may include a rectifier and a Schmit trigger. The pulse shaper 56 produces a pulse for each positive going half cycle of the generator 50 which are counted by a reset counter 58.

The counter 58 counts a predetermined number of the pulses from the pulse shaper 56, then resets. For example, if the generator 50 produces 60 cycles per second, the counter 58 mignt count 12 pulses, then reset, to provide a reset rate of 5 per second. A decoder 60 produces a logic level on outputs 62, 63 and 64 in response to three different counts on the counter 58. For example, the decoder 60 might produce a logic 1 level on output 62 when the counter reaches the count of one, a logic 1 level on output 63 when the counter reaches five, and a logic 1 level on output 64 when the counter reaches nine.

Inverter 66 applies the complement of the pulse shaper 56 to each of the AND gates 68, 69 and 70. As a result, AND gate 68 produces an output pulse at the beginning of the negative half cycle from the generator 50 which follows the positive pulse that reset the counter 58 to the count of one. AND gate 69 produces an output at the start of the negative going cycle following the pulse which caused the counter 58 to increment to the count of five, and AND gate 70 produces an output at the start of the negative half cycle after the pulse that incremented the counter 58 to a count of nine.

One output from the generator 50 is connected to ground, and the other is connected by way of ON-OFF switches 72, 73 and 74 to trigger circuits 75, 76 and 77. The trigger circuits 76 and 77 are identical to the trigger circuit 75, and accordingly, only trigger circuit 75 will now be described in detail. The power from generator 50 is connected through switch 72 to an auto transformer 78. The output from the auto transformer 78 is connected through a rectifying means comprised of a pair of diodes 80 to the output of the trigger circuit. A gate controlled rectifier 90, such as a silicon controlled rectifier (SCR), and a current limiting resistor 92 are connected parallel to the diode 80. The output pulse from AND gate 68 passes through the primary winding 94 of a transformer and then to ground. This pulse induces a current in the secondary winding 96 which is connected to the gate of the SCR 90 and turns the SCR on. Diode 98 and resistor 100 are provided to protect the SCR in the conventional manner. An insulated conductor 82 from tensioning spool 84 is connected to the output of the trigger circuit and to an input terminal 86 of the pulse circuit 88 wich is disposed within the watertight container 36 mounted on the door 20 of the trawl 12. The input terminal 86 is connected through the primary winding 102 of a transformer to a first plate of a large capacitor 104. The second plate of the capacitor is connected to an output terminal 106 of the pulse circuit. The first plate of the capacitor 104 is also connected by an SCR 108 to a second output terminal 110. The SCR 108 is turned "on" only by current induced in the secondary winding 112 of the transformer as a result of current discharged from the capacitor 104 though the primary winding 102. A diode 114 and resistor 116 protect the SCR 108 in the conventional manner.

The output 110 of the pulse generator is connected to electrodes 40a of the array, and the other output 106 is connected to the alternate electrodes 40b. Output 106 is also connected to the tow cable 30 which is connected through the winch 118 on the boat 10 to ground.

The output from the trigger circuit 76 is similarly connected through an insulated conductor 120 from a tensioning spool 122 to the input of a pulse generator 124, which is located on the trawl 14. The output from the pulse generator 124 is connected to the electrode array 126 to the trawl 14 and to the cable 128 from the winch 130 used to tow the trawl 14. The output from the trigger 77 is connected to tensioning spool 131 to insulated cable 132 and then to the pulse generator 134, which is located on the try net 16. The outputs from the pulse generator 134 are connected to an electrode array 136 of the try net and to the tow cable 138 which is grounded through the winch 140.

Figure 6:
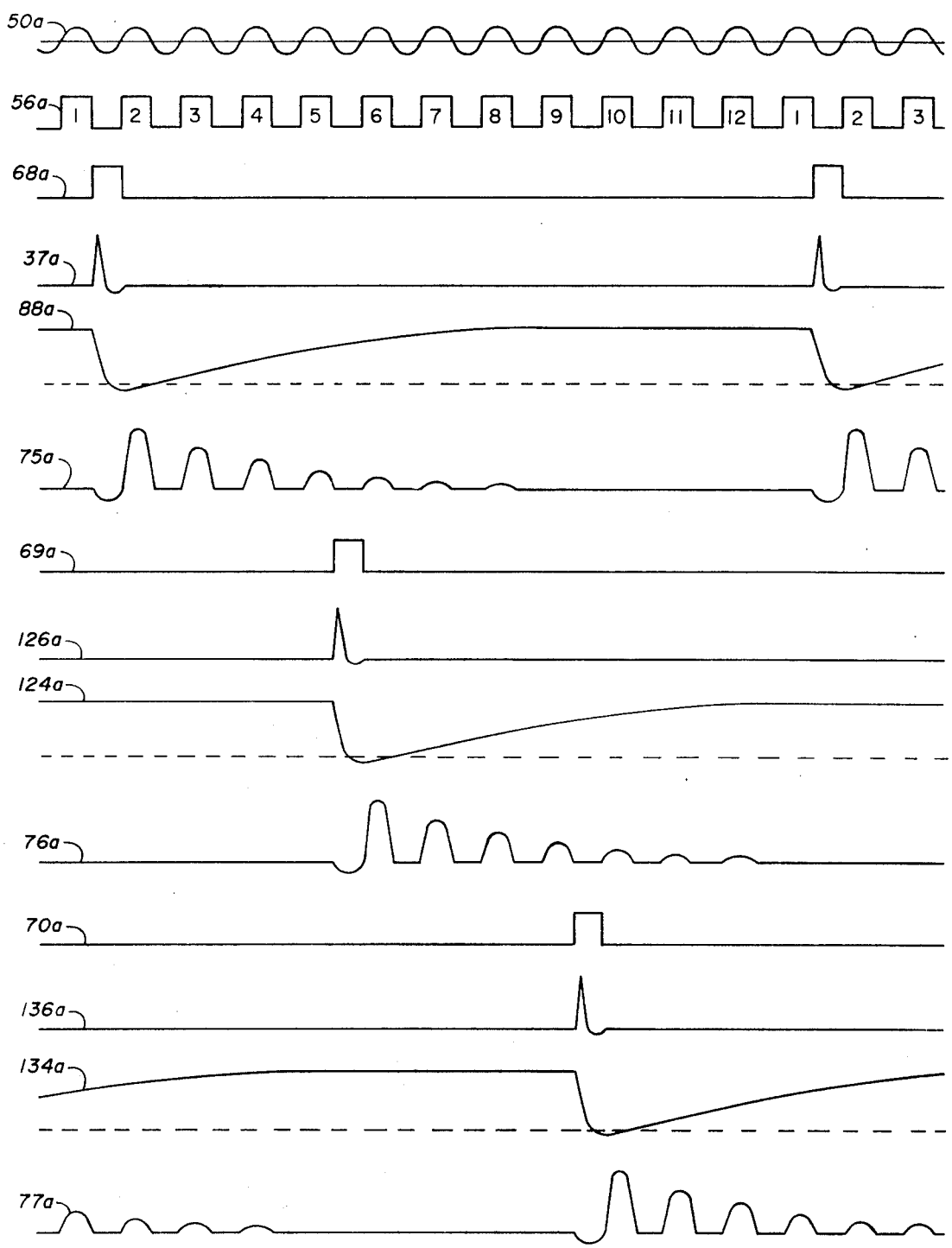
FIG. 6 is a timing diagram which serves to illustrate the operation of the system of FIG. 5.

The operation of the system of FIG. 5 may best be understood by reference to the timing diagram of FIG. 6. Assuming that the switches 72, 73 and 74 are closed so that all nets are in operation, the capacitor 104 of each of the pulse generators would be charged by current through the diodes 80 so that the plate connected to the primary winding 102 is positive with respect to output 106, which is grounded. This charge is held by diodes 80 because SCR's 90 and 108 are turned "off". The charge on the capacitor 104 is represented by curve 88a.

Assume that the output from the generator 50 is represented by wave form 50a. The output from the pulse shaper 56 might then appear as the wave form 56a. The counter 58 increments to the counts designated 1-12 in connection with the wave form 56a. If the decoder 60 produces a logic 1 level on outputs 62, 63 and 64 on the counts of one, five, and nine, respectively, then the output from gates 68, 69 and 70 would be indicated by wave forms 68a, 69a and 70a. As the output from AND gate 68 rises, the current induced in secondary winding 96 turns SCR 90 "on" which starts to discharge capacitor 104 through the primary winding 102. This immediately induces sufficient current in the secondary winding 112 to turn SCR 108 "on", which immediately discharges capacitor 104 across the adjacent electrodes 40a and 40b of the array 37 connected to the outputs 106 and 110. This current pulse is represented by the wave form 37a in FIG. 6.

It is important to note that this occurs at the beginning of a negative half-cycle from the generator 50. As the SCR 90 continues to conduct during the negative half-cycle, the charge on the capacitor 104 goes negative, thus reverse biasing SCR 108 to insure a sharp cutoff. Then as the output of the generator 50 again goes positive, SCR 90 is reversed bias to cutoff as a result of the voltage drop across diodes 80, thus again setting up the condition which permits the capacitor 104 to be charged.

The current output from the trigger circuit 75 is indicated by wave form 75a. It will be noted that during the initial charging cycle of the capacitor 104, the current to the capacitor is relatively large, but decreases exponentially as the charge on the capacitor is increased. The load on the generator 50 is materially reduced by the time the counter 58 has reached the count of five so that an output is produced from gate 69 to actuate trigger circuit 76. The pulse from gate 69 is represented by wave form 69a. This results in a current pulse being delivered to electrode array 126, as represented by wave form 126a by the discharge of the capacitor 104 of the pulse generator 124, the voltage of which is represented by the wave form 124a, and the subsequent drawing of current from the trigger circuit 76 as represented by wave form 76a to recharge the pulse generator 124. The AND gate 70 produces an output following a count of nine, as represented by wave form 70a, the load on the generator 50 has been reduced as represented by wave form 76a. The pulse 70a results in a current pulse represented by wave form 136a, being delivered to the electrode array 136 with the attendant decrease in the charge on the capacitor of the pulse generator 134, as represented by wave form 134a, and a subsequent current drain through the trigger circuit 77, as represented by wave form 77a. Thus it will be noted that the load on the generator 50 is substantially equalized.

Assuming that the generator 50 produces 60 cycle power, each of the electrode arrays will produce pulses at a rate of five per second. Of course, other pulse rates can be produced by either changing the length of the reset cycle of counter 58, by changing the pulse rate produced by pulse shaper 56.

Figure 7:
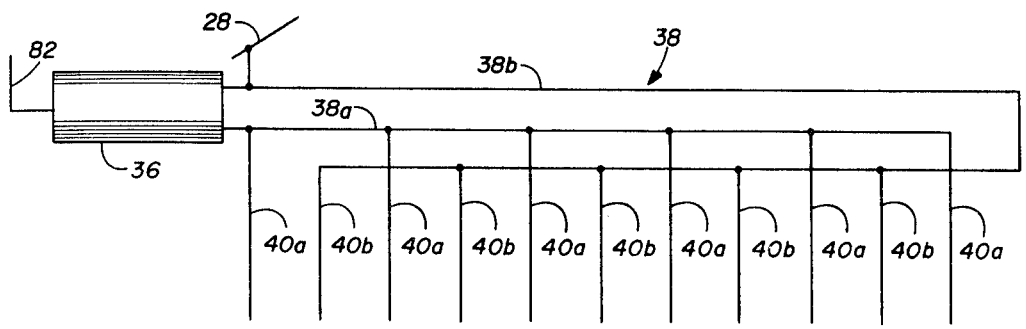
FIG. 7 is a schematic circuit diagram of the electrode array illustrated in FIGS. 2—4.

Referring now to FIG. 7, the bus 38 is comprised of a pair of conductors 38a and 38b which are connected to outputs 110 and 106, respectively. Electrodes 40a are connected to conductor 38a. It will be noted that the conductor 38b extends across the array and returns from the opposite side before being connected to the electrodes 40b. This insures that the voltage between each adjacent pair of electrodes 40a and 40b is constant over the entire array and is not distorted by IR drops across the array.

Figure 8:
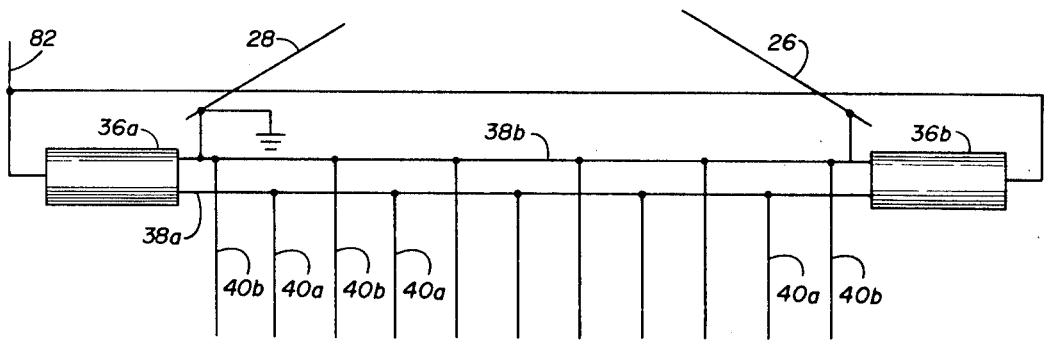
FIG. 8 is a schematic circuit diagram of an alternative electrode array in accordance with the present invention.

An alternative configuration is illustrated in FIG. 8 wherein two pulse generators 36a and 36b, identical to the pulse generator 36, are mounted on the trawl doors 20 and 18, respectively. In this case, both of the pulse circuits 36a and 36b are charged and discharged through the same insulated conductor 82, and the ground returns are connected to bridle cables 26 and 28, and thus by cable 30.

Figure 9:
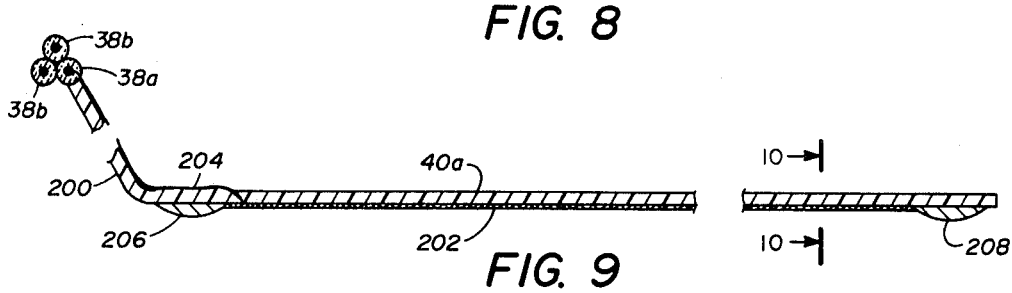
FIG. 9 is a side view of one of the electrodes of the array of the trawl net of FIG. 2.

Each of the electrodes 40a and 40b are preferably constructed as illustrated in FIG. 9, although it is to be understood that other types of electrodes can be used with the system of the present invention. The electrode 40a, for example, is comprised of a strip of flat plastic material 200 which is mechanically connected to the bus wires 38 for support. A flat braided metal electrode 202 is connected to the lower surface of the insulating material 200 along a substantial portion of its length. This metal electrode 202 is electrically connected by a wire 204 to the bus wire 38a. A weight 206 is attached to the lower face of the plastic strip 200 at point spaced from the bus wires 38, and a similar weight 208 is attached at the rear end so that the electrode 202 will be disposed in a generally horizontal position adjacent the bottom as the trawl is towed through the water.

Figure 10:
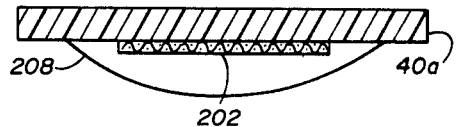
FIG. 10 is a sectional view taken substantially on lines 10—10 of FIG. 9.

The electrode construction illustrated in FIGS. 9 and 10 increases the resistance above the elctrodes so that more current is directed into the bottom, thus increasing the voltage applied to the shrimp. If desired, the braided electrodes may be passed though the plastic strip to the top side for short intervals to direct the electric current upwardly, and thus continue to stimulate the shrimp above the plane of the electrodes from time to time.

Since the bus cables 38 are disposed a substantial distance above the bottom of the trawl doors, the cables will pass over rocks, seaweed and other obstacles. The length of the plastic strip between the bus wires 38 and the forward weight 206 is preferably sufficient for the electrodes to sink substantially below the plane of the footrope and the bottom of the trawl doors, and thus enable the electrodes to penetrate seaweed and the like to a position adjacent the bottom.

Figure 11:
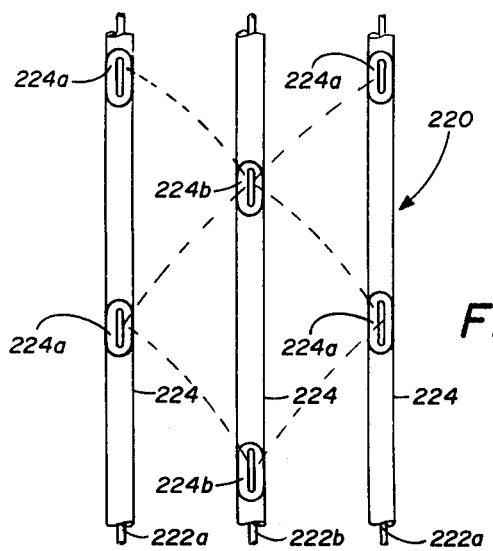
FIG. 11 is a bottom view of a portion of another electrode array in accordance with the present invention.

Another electrode array in accordance with the present invention is indicated generally by the reference numerals 220 in FIG. 11. FIG. 11 is a bottom view of three electrodes of the array which are designated 222a and 222b. Each electrode may be a conventional braided or twisted cable with insulation 224. The electrodes 222a and 222b are connected to the positive and negative wires 38a and 38b, respectively. The electrode wires 222a and 222b may be covered with conventional insulation 224 which has been cut away to expose the wire in areas 224a and 224b, respectively. The areas 224a are staggered in relation to the areas 224b so that current flows in lines extending diagonally of the direction of travel of the array. As a result of this arrangement, the current is again directed downwardly into the mud, but in a crossed rather than a parallel pattern. As a result, a shrimp burrowed in the bottom will be subjected to current from two different directions as the array passes. This substantially reduces the possibility that a shrimp will be lying at 90° to the current flow, and thus will not be stimulated by a sufficient voltage from head to tail to cause the involuntary contraction necessary to deburrow te animal.

Although preferred embodiments of the invention have been described, it is to be understood various changes, substitutions and alterations can be made therein without departing from the spirit of the scope of the invention as defined by the appended claims.

What is claimed is:

1. A pulse circuit comprisng:
   first, second and third terminals, said first and second terminals comprising input terminals and said second and third terminals comprising output terminals for the pulse circuit;
   a capacitor having first and second plates connected between said input terminals for charging by a charging current applied by a voltage across said input terminals;
   a gate controlled rectifier connecting said first plate to the third terminal;
   means connected to said input terminals for initiating a discharging current between the capacitor and the first terminal said discharging current having a polarity opposite to the charging current; and
   gate circuit means connected to said gate controlled rectifier and responsive to said discharging current for turning the gate controlled rectifier on to discharge the capacitor through a load connected between the terminals.

2. The pulse circuit of claim 1 further characterized by a first voltage source connected across the input terminals for charging the capacitor with said charging current; and wherein said initiating means comprises trigger means connected across the input terminals for selectively disconnecting said first voltage source from said input terminals and initiating discharge of the capacitor across the input terminals to generate said discharge current and activate said gate circuit means, said discharge of the capacitor across the input terminals being at a slower rate than the discharge of the capacitor through the gate controlled rectifier and the load when the gate controlled rectifier is turned on.

3. The pulse circuit of claim 2 wherein said initiating means is further characterized by a second voltage source having a polarity opposite to that of the first voltage source selectively connected by the trigger means to the input terminals as the first voltage surce is disconnected from the input terminals to initiate discharge of the capacitor across the input terminals.

4. The pulse circuit of claim 1 further characterized by a source of alternating current; and rectifier means connecting the source to the input terminals for charging the capacitor with said charging current; and wherein said initiating means comprises controllable circuit means for selectively disconnecting the source from the input terminals for selectively discharging the capacitor and reverse biasing the gate controlled rectifier to cutoff.

5. The pulse circuit of claim 4 wherein the controllable circit means comprises a second gate controlled rectifier connected between the source and the first terminal in parallel with the rectifier means.

6. A circuit for generating a pulse comprising:

first, second and third terminals, said first and second terminals comprising input terminals, and said second and third terminals comprising output terminals for the pulse generating circuit;

source means connected across said input terminals for selectively applying first or second currents having polarities opposite to each other across said input terminals;

a capacitor connected between the input terminals for storing a charge as a result of said first current of one polarity applied by said source means across the input terminals.

actuable discharge means connected between the capacitor and the third terminal for selectively connecting the capacitor across the output terminals to discharge the capacitor through a load connected across the output terminals; and actuating means responsive to the flow of said second current between the capacitor and the first input terminal for actuating said actuable discharge means in response to said second current to substantially discharge said capacitor through said load connected across the output terminals, thereby generating said pulse.

7. The pulse generating circuit of claim 6 wherein said actuable discharge means comprises a gate controlled rectifier connected between the capacitor and the third terminal and having a gate connected to said gate circuit means.

8. The circuit of claim 6 wherein the actuating means is inductively coupled to the circuit between the capacitor and the first input terminal.

9. The circuit of claim 6 wherein said source means comprises a source of current of one polarity connected to said input terminals for charging the capacitor with said first current; and means for shorting the source of current to start the discharge of the capacitor across the input terminals initiating the flow of said second current to actuate said discharge means and discharge the capacitor across said output terminals.

10. The system of claim 7 wherein said source means comprises rectifier means connected between the first input terminal and a source of alternating current for charging the capacitor with said first current; and switching means connected in parallel with the rectifier means to the first input terminal for selectively discharging the capacitor across the input terminals by bypassing the rectifier means with said second current between the capacitor and the first input terminal to turn the gate controlled rectifier on and discharge the capacitor across said output terminals.

11. The system of claim 10 wherein the switching means bypasses the rectifier means and starts the discharge of the capacitor across the input terminals during the portion of the source cycle when no current is being supplied to charge the capacitor.

12. The system of claim 10 wherein the switching means connects the first input terminal to the source during the portion of the alternating cycle in which the source voltage has a polarity opposite to the charge on the capacitor whereby the gate controlled rectifier will be back biased and turned off after the capacitor has been discharged.

13. A pulse generating circuit comprising:

a first input terminal, a third output terminal and a second terminal common to the input and the output of said pulse generating circuit;

a capacitor having a first plate connected between said first input terminal and said third output terminal and a second plate connected to said second common terminal, said capacitor being chargeable in response to a voltage of a first polarity across said first and second terminals and being dischargeable in response to a voltage of a second polarity across said first and second terminals;

actuable switching means connected between said first plate and said third output terminal to selectively discharge said capacitor across said third output terminal and said second common terminal to generate an output pulse; and actuating means connected between said first plate and said first input terminal to actuate said switching means in response to the discharge of said capacitor across said first and second terminals.

14. The pulse generating circuit of claim 13 wherein said actuable switching means comprises a gate controlled rectifier and wherein said actuating means comprises a control circuit connected to the gate of said rectifier to selectively actuate said rectifier, including a transformer having a first coil connected between said first plate and said first input terminal and a second coil connected to said gate, said tranformer being responsive to the discharge of said capacitor across said first and second terminals to actuate said gate controlled rectifier and discharge said capacitor across said first and second terminals.

* * * * *